(12) United States Patent
Hui et al.

(10) Patent No.: US 6,638,792 B2
(45) Date of Patent: Oct. 28, 2003

(54) METHOD FOR FABRICATING BOC SEMICONDUCTOR PACKAGE

(75) Inventors: Chong Chin Hui, Singapore (SG); Lee Choon Kian, Singapore (SG); Lee Kian Chai, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/047,903

(22) Filed: Jan. 17, 2002

(65) Prior Publication Data

US 2002/0102831 A1 Aug. 1, 2002

Related U.S. Application Data

(62) Division of application No. 09/774,130, filed on Jan. 30, 2001, now Pat. No. 6,507,114.

(51) Int. Cl.[7] .................... H01L 21/44; H01L 21/48; H01L 21/50
(52) U.S. Cl. .................. 438/118; 438/112; 438/124; 438/127; 438/613; 438/617; 257/738; 257/780; 257/786
(58) Field of Search .................. 257/738, 780, 257/786; 438/112, 118, 124, 127, 613, 617

(56) References Cited

U.S. PATENT DOCUMENTS

| | | | |
|---|---|---|---|
| 5,866,949 A | * | 2/1999 | Schueller .................. 257/778 |
| 5,956,233 A | | 9/1999 | Yew et al. |
| 6,013,948 A | | 1/2000 | Akram et al. |
| 6,020,629 A | | 2/2000 | Farnworth et al. |
| 6,040,621 A | | 3/2000 | Nose |
| 6,048,755 A | | 4/2000 | Jiang et al. |
| 6,049,129 A | | 4/2000 | Yew et al. |
| 6,087,203 A | | 7/2000 | Eng et al. |
| 6,091,140 A | | 7/2000 | Toh et al. |
| 6,097,087 A | | 8/2000 | Farnworth et al. |
| 6,118,179 A | | 9/2000 | Farnworth et al. |
| 6,122,171 A | | 9/2000 | Akram et al. |
| 6,150,194 A | * | 11/2000 | Sakaguchi et al. .......... 438/118 |
| 6,177,725 B1 | * | 1/2001 | Yamada et al. ............. 257/704 |
| 6,245,598 B1 | * | 6/2001 | Chen et al. ................. 257/698 |
| 6,291,884 B1 | * | 9/2001 | Glenn et al. ................ 257/747 |
| 6,300,231 B1 | * | 10/2001 | Haba et al. ................. 438/118 |
| 6,384,487 B1 | * | 5/2002 | Smith ......................... 257/790 |
| 6,507,114 B2 | | 1/2003 | Hui et al. |

FOREIGN PATENT DOCUMENTS

| | | | | |
|---|---|---|---|---|
| JP | 9-51051 A | * | 2/1997 | .......... H01L/23/12 |
| JP | 9-051051 A | * | 2/1997 | .......... H01L/23/12 |
| JP | 11163196 A | | 6/1999 | |
| WO | WO 97/35342 | | 9/1997 | |

* cited by examiner

*Primary Examiner*—Eddie Lee
*Assistant Examiner*—Matthew E Warren
(74) *Attorney, Agent, or Firm*—Stephen A. Gratton

(57) ABSTRACT

A BOC (board-on-chip) semiconductor package includes a semiconductor die having die contacts, a substrate bonded circuit side down to the die, and an adhesive layer bonding the substrate to the die. The substrate includes a circuit side having a pattern of conductors and wire bonding sites, and a back side having an array of external contacts (e.g., BGA solder balls) in electrical communication with the conductors. The bonding sites on the conductors overhang the peripheral edges of the substrate such that access is provided for bonding wires to the bonding sites and to the die contacts. Because the substrate is bonded circuit side down to the die, a loop height of the wires, and an overall height (profile) of the package are reduced by a thickness of the substrate. In addition, a planarity of molded segments that encapsulate the wires is improved, and mold bleed during molding of the molded segments is reduced. A method for fabricating the BOC package includes the steps of: providing the die with the die contacts, providing the substrate with the conductors and the overhanging wire bonding sites on the circuit side and external contacts on the back side, bonding the substrate circuit side down to the die, wire bonding the wires to the wire bonding sites and to the die contacts, and then forming the molded segments to encapsulate the wires.

23 Claims, 5 Drawing Sheets

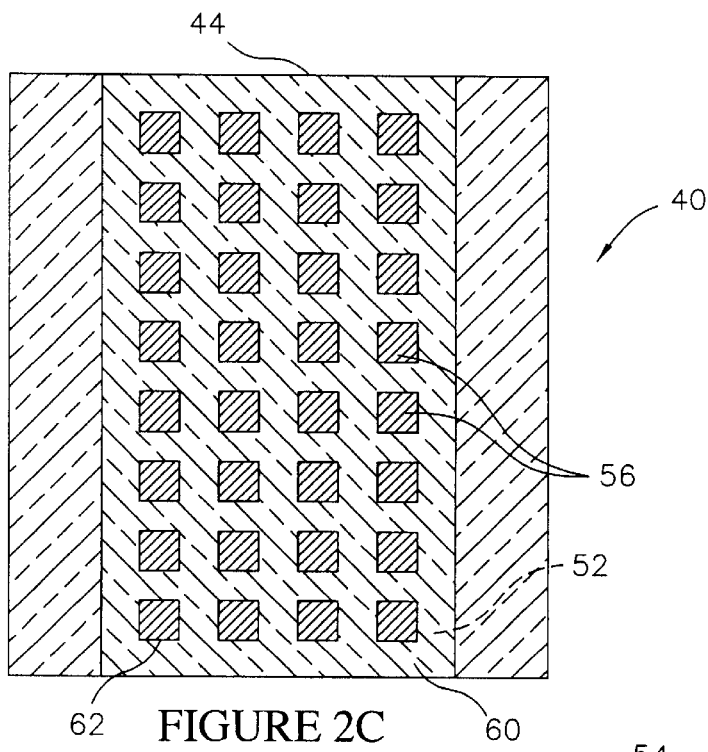
FIGURE 2C
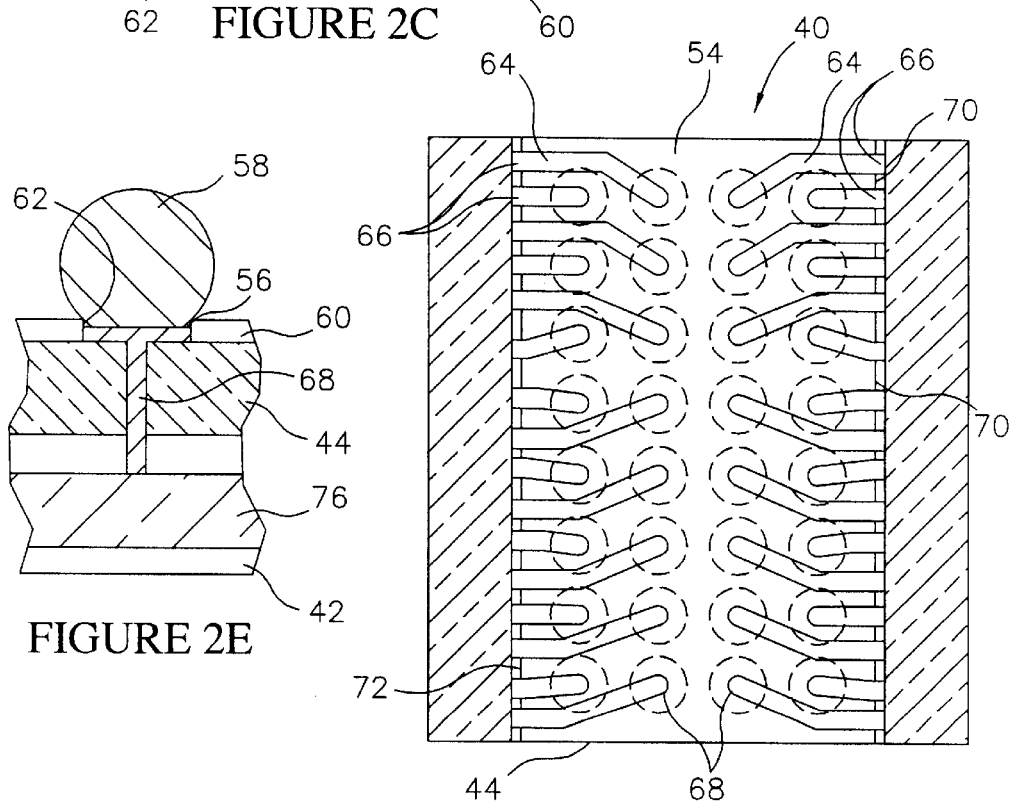
FIGURE 2E
FIGURE 2D

METHOD FOR FABRICATING BOC SEMICONDUCTOR PACKAGE

This application is a division of application Ser. No. 09/774,130 filed on Jan. 30, 2001 now U.S. Pat. No. 6,507,114.

FIELD OF THE INVENTION

This invention relates generally to semiconductor packaging, and specifically to a board-on-chip package that includes a semiconductor die, and a substrate bonded circuit side down to the die. This invention also relates to a method for fabricating the package, and to electronic assemblies incorporating the package.

BACKGROUND OF THE INVENTION

One type of semiconductor package is referred to as a "chip scale package". Chip scale packages are also referred to as "chip size packages", and the dice are referred to as being "minimally packaged". Chip scale packages can be fabricated in "uncased" or "cased" configurations. Uncased chip scale packages have a "footprint" (peripheral outline) that is about the same as an unpackaged die. Cased chip scale packages have a peripheral outline that is slightly larger that an unpackaged die. For example, a footprint for a typical cased chip scale package can be about 1.2 times the size of the die contained within the package.

A conventional chip scale package includes a substrate bonded to the die. Typically, the substrate comprises an organic material, such as bismaleimide triazine (BT), an epoxy resin (e.g., "FR-4") or a polyimide resin. The substrate includes a pattern of conductors, such as copper traces, that are wire bonded, or other wise electrically connected, to bond pads, or other connection points, on the die.

The substrate also includes external contacts in electrical communication with the conductors. Typically, the external contacts comprise solder balls arranged in a dense array, such as a ball grid array (BGA), or a fine ball grid array (FBGA). These dense arrays permit a high input/output capability for the chip scale package. For example, a FBGA on a chip scale package can include several hundred solder balls. The pattern of conductors on the substrate, and the associated bonding sites for the external contacts, is sometimes referred to as a "circuit".

One type of chip scale package is known as a board-on-chip (BOC) package. With a BOC package the substrate (i.e., the board) is bonded to the circuit side (face) of the die, and wire bonds are made between the conductors on the substrate and the bond pads on the die.

Referring to FIGS. 1A and 1B, a conventional BOC package 10 is illustrated. The BOC package 10 includes a semiconductor die 12 having a circuit side 14, and a pattern of bond pads 16 on the circuit side 14. The bond pads 16 are in electrical communication with the integrated circuits and semiconductor devices contained on the die 12. The BOC package 10 also includes a substrate 18 bonded to the circuit side 14 of the die 12. The substrate 18 has a circuit side 22 containing a pattern of conductors 24, and an adhesive layer 20, which bonds the substrate 18 to the die 12. The substrate 18 has a peripheral outline that is smaller than the peripheral outline of the die 12, such that the bond pads 16 are not covered by the substrate 18 and the adhesive layer 20.

The BOC package 10 also includes an array of external contacts 26 on the substrate 18 in electrical communication with the conductors 24. The external contacts 26 comprise solder balls in a grid array, such as a ball grid array (BGA) or a fine ball grid array (FBGA). The external contacts 26 are bonded to ball bonding sites 30 on the conductors 24 using a bonding technique such as soldering, welding or brazing. A solder mask 32 on the substrate 18 facilitates bonding and electrical isolation of the external contacts 26. The conductors 24 also include wire bonding sites 30, and wires 34 are wire bonded to the wire bonding sites 30, and to the bond pads 16 on the die 12. The BOC package 10 also includes an encapsulant 36 that encapsulates the wires 34 and the associated wire bonds on the wire bonding sites 30 and on the bond pads 16. Typically, the encapsulant 36 comprises a Novolac based epoxy formed in a desired shape using a transfer molding process, and then cured using an oven.

One feature of this type of BOC package 10 is that using standard wire bonding techniques the wires 34 are formed with a loop height W1. In addition, the encapsulant 36 must have a width X1, and a thickness Y1 which insures that the wires 34 are fully covered by a desired covering thickness Z1 (e.g., 0.02 mm to 0.10 mm). Accordingly, the thickness Y1 of the encapsulant 36 must be selected to be at least equal to the loop height W1 plus the covering thickness Z1 (Y1=W1+Z1). An overall height YP (profile) of the package 10 is thus affected by the loop height W1, by the covering thickness Z1, and by the thickness Y1 of the encapsulant 36.

It would be advantageous to be able to decrease the loop height W1 and the thickness Y1 of the encapsulant 36. In particular, reductions in the loop height W1 and the thickness Y1 of the encapsulant 36 would allow the overall height YP of the package 10 to be decreased. Similarly, it would be advantageous to be able to decrease the width X1 of the encapsulant 36, as this would decrease the footprint of the BOC package 10.

Another feature of the BOC package 10 is that the relatively large thickness Y1 of the encapsulant 36 forms a recess 38 proximate to the external contacts 26. In order to make electrical contact with a mating substrate, such as a printed circuit board, the external contacts 26 must have a diameter D1 that is larger than the depth D2 of the recess 38. In order to satisfy this requirement the external contacts 26 must be larger than otherwise required. It would be advantageous to be able to decrease the depth D2 of the recess 38.

Yet another feature of the BOC package 10 is that during molding of the encapsulant 36, some mold material may bleed onto the solder mask 32. The mold bleed can adversely affect bonding of the external contacts 26 to the bonding sites 28. The mold bleed can also adversely affect the electrical connections to the external contacts 26, and the cosmetic appearance of the BOC package 10.

The present invention is directed to an improved BOC package that has a reduced thickness, and a smaller footprint than the prior art BOC package 10. In addition, the BOC package uses less encapsulant material, has less mold bleed, and a substantially planar encapsulant surface. The present invention is also directed to a method for fabricating the improved package, and to improved electronic assemblies incorporating the package.

SUMMARY OF THE INVENTION

In accordance with the present invention, an improved BOC package, a method for fabricating the BOC package, and electronic assemblies incorporating the BOC package are provided.

The BOC package includes a semiconductor die, a substrate adhesively bonded to the die, and an array of external contacts (e.g., BGA solder balls) on the substrate. The BOC package also includes wires that are wire bonded to the die and to the substrate, and molded segments on either side of the substrate for encapsulating the wires.

The semiconductor die includes a circuit side (face) having a pattern of die contacts in electrical communication with the integrated circuits contained on the die. The substrate also includes a circuit side (face) having a pattern of conductors and wire bonding sites located outside of the peripheral edges of the substrate. In addition, the substrate includes a back side with the external contacts and ball bonding sites for bonding the external contacts to the substrate.

In the BOC package the substrate is bonded to the die with its circuit side "down", or "facing" the circuit side of the die (i.e., circuit side to circuit side). Stated differently, the circuit side of the substrate faces "in" relative to the exterior of the package, rather than "out" as with conventional BOC packages. This arrangement permits a loop height of the wires, and a height of the molded segments, to be decreased by a distance equal to a thickness of the substrate. In addition, a width of the molded segments is decreased, such that a footprint of the BOC package is decreased. Further, a planarity of exterior surfaces of the molded segments is improved, and mold bleed during formation of the molded segments is decreased.

The method for fabricating the package includes the steps of: providing the semiconductor die with the circuit side having the die contacts; providing the substrate with the circuit side having the pattern of conductors and wire bonding sites, and with the back side having the ball bonding sites in electrical communication with the conductors; adhesively bonding the circuit side of the substrate to the circuit side of the die; wire bonding the wires to the wire bonding sites on the substrate and to the die contacts on the die; forming the molded segments to encapsulate the wires; and bonding the external contacts to the ball bonding sites on the substrate.

An electronic assembly, such as a multi chip module, includes a substrate and multiple BOC packages flip chip mounted the substrate. Because the BOC packages have a reduced height, a height of the assembly is also reduced.

BRIEF DESCRIPTION OF THE DRAWINGS

FIG. 2C is a cross sectional view of the BOC package taken along section line 2C—2C of FIG. 2B;

FIG. 2D is a cross sectional view of the BOC package taken along section line 2D—2D of FIG. 2B;

FIG. 2E is an enlarged cross sectional view of an external contact on the BOC package taken along section line 2E—2E of FIG. 2B;

DETAILED DESCRIPTION OF THE PREFERRED EMBODIMENTS

Figure 2A:
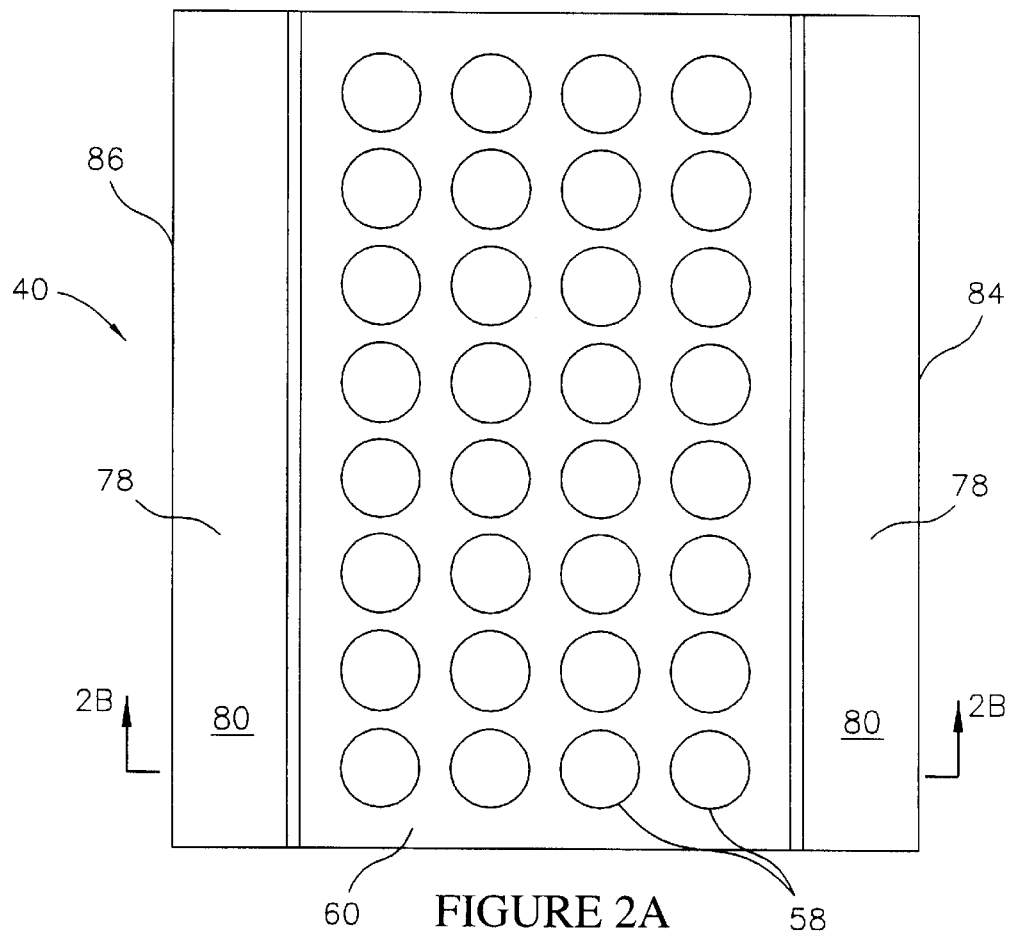
FIG. 2A is an enlarged bottom view of a BOC package constructed in accordance with the invention.
Figure 2B:
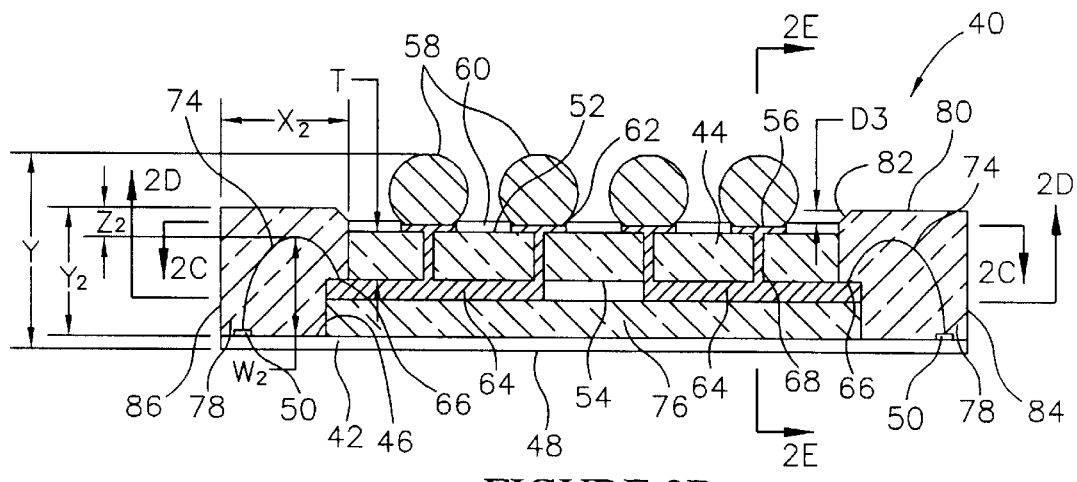
FIG. 2B is an enlarged cross sectional view of the BOC package taken along section line 2B—2B of FIG. 2A.

Referring to FIGS. 2A and 2B, a BOC package 40 constructed in accordance with the invention is illustrated. The BOC package 40 includes a semiconductor die 42 and a substrate 44 bonded to the die 42.

The die 42 includes a semiconductor substrate, such as silicon or gallium arsenide, containing integrated circuits fabricated using well known processes. The die 42 can be a conventional semiconductor component such as a dynamic random access memory (DRAM), a synchronous DRAM (SDRAM), a static random-access memory (SRAM), an erasable programmable read-only memory (EPROM), a logic circuit (LOGIC), or any other semiconductor device that requires packaging.

The die 42 includes a circuit side 46 (face) and a back side 48. In addition, the die 42 includes a pattern of die contacts 50 on the circuit side 46 in electrical communication with the integrated circuits contained on the die 42. In the illustrative embodiment, the die contacts 50 comprise planar bond pads formed of a wire bondable material (e.g., aluminum). However, the die contacts 50 can comprise any type of die contact including bumped contacts. Also for illustrative purposes, the die contacts 50 are shown as being raised above the surface of the circuit side 46. However, the die contacts 50 can also be recessed below a passivation layer on the circuit side 46 of the die 42 as is conventional. Also, a thickness of the die 42 can be conventional with a thickness of between about 0.2 mm and 0.5 mm being representative.

The substrate 44 for the BOC package 40 comprises an electrically insulating material such as an organic polymer resin reinforced with glass fibers. Such a material is sometimes referred to as "circuit board" material, such that the substrate 44 can also be referred to as a "board". Suitable materials for the substrate 44 include bismaleimide-trizine (BT), epoxy resins ("FR-4" and "FR-5"), and polyimide resins. A representative thickness T (FIG. 2B) of the substrate 44 can be from about 0.2 mm to 1.6 mm.

As also shown in FIG. 2B, the substrate 44 includes a back side 52 and a circuit side 54. The back side 52 of the substrate 44 includes ball bonding sites 56, and external contacts 58 bonded to the ball bonding sites 56. As shown in FIG. 2C, the ball bonding sites 56 comprise generally square shaped metal pads arranged in a dense grid array. The external contacts 58 comprise solder balls bonded to the ball bonding sites 56. A representative diameter of the external contacts 58 can be from about 0.1 mm to 0.5 mm. In addition, the external contacts 58 can be bonded to the ball bonding sites 56 using any suitable process, such as solder reflow, welding, brazing, or laser heating. The material for the ball bonding sites 56 and the material for the external contacts 58 can be selected to facilitate the bonding process.

The back side 52 of the substrate 44 also includes a solder mask 60 having via openings 62 aligned with the ball bonding sites 56. The solder mask 60 can comprise a photoimageable dielectric material, such as a negative or positive tone resist. Such a material can be blanket deposited to a desired thickness, then exposed and developed to form the via openings 62. A representative thickness of the solder mask 60 can be from about 1 mils to 4 mils.

The substrate 44 also includes a pattern of conductors 64 on the circuit side 54. In addition, a plurality of conductive vias 68 through the substrate 44 establish electrical communication between the conductors 64 on the circuit side 54, and the ball bonding sites 56 on the back side 52 of the substrate 44. As shown in FIG. 2E, the conductive vias 68 comprise openings in the substrate 44 at least partially filled with a conductive material, such as metal or a conductive polymer. As shown in FIG. 2D, the conductors 64 fan out from the conductive vias 68 to the edges 70, 72 of the substrate 44. In addition, the conductors 64 include wire bonding sites 66 arranged in a spaced array along the edges 70, 72 of the substrate 44. Preferably the conductors 64 comprise a highly conductive wire bondable metal such as copper.

As shown in FIG. 2D, the wire bonding sites 66 comprise portions of the conductors 64 that overhang the edges 70, 72 of the substrate 44. In addition, the wire bonding sites 66 are located on a backside of the conductors 64. The configuration of the wire bonding sites 66 provides access for wire bonding thin bond wires 74 (FIG. 2B) to the conductors 64. As shown in FIG. 2B, the bond wires 74 are also wire bonded to the die contacts 50 on the circuit side 46 of the die 42. In addition, an encapsulant 78 is molded to the substrate 44, and to the die 42, to form generally rectangular shaped molded segments 84, 86 (FIG. 2A) along the edges 70, 72 of the substrate 44. The molded segments 84, 86 encapsulate and protect the bond wires 74, and the associated wire bonds on the bonding sites 66 and die contacts 50.

As also shown in FIG. 2B, the BOC. package 40 includes an adhesive layer 76 which bonds the substrate 44 to the die 42. The adhesive layer 76 can comprise a double sided polymer tape such as a lead-on-chip tape, or a cured polymer adhesive such as an epoxy, polyimide or acrylic adhesive. The substrate 44 is bonded to the die 42 with its circuit side 54 facing the circuit side 46 of the die 42 (i.e., circuit side to circuit side).

With this arrangement the surfaces of the conductors 64 face inward relative to exterior portions of the BOC package 40, and are protected by the bulk of the substrate 44. However, the wire bonding sites 66 on the overhanging portions of the conductors 64 are located on the opposing inner surfaces of the conductors 64 to permit access for wire bonding. In addition, the adhesive layer 76 has a peripheral outline that is larger than the peripheral outline of the substrate 44 to provide support for the wire bonding sites 66.

Figure 1A:
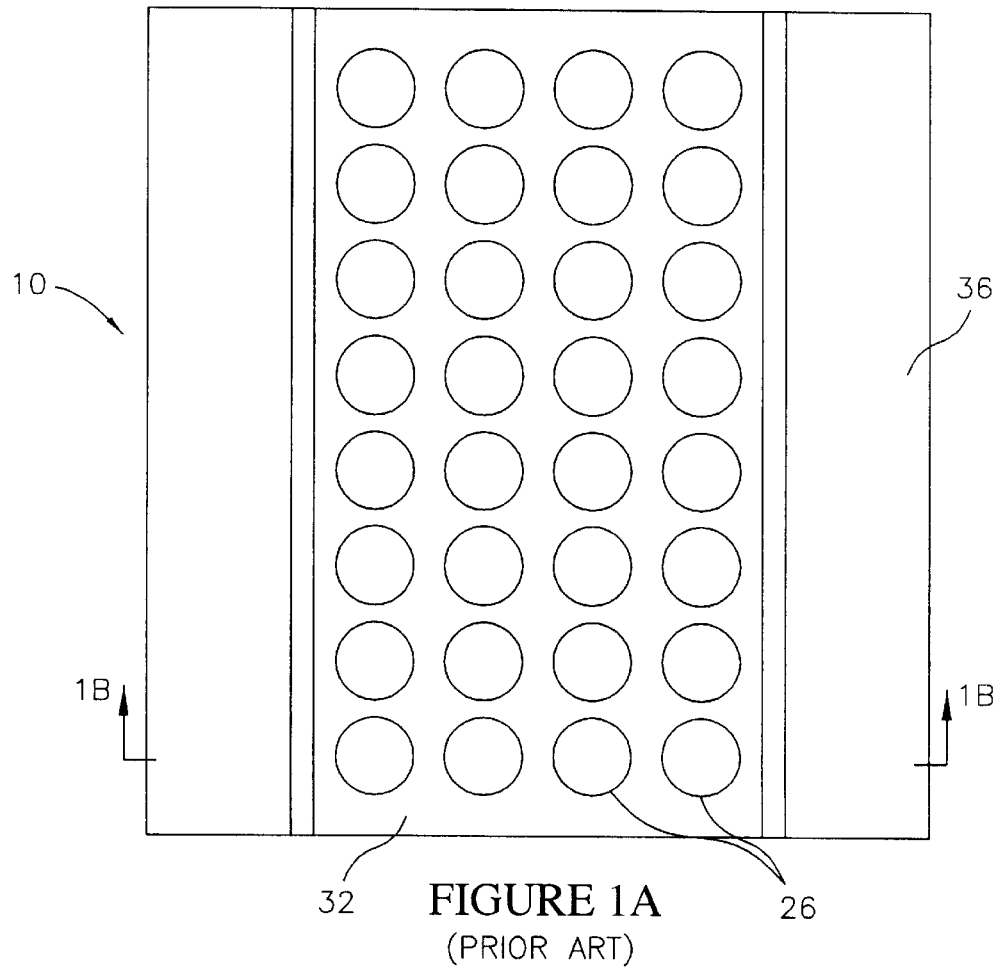
FIG. 1A is an enlarged bottom view of a prior art BOC package.
Figure 1B:
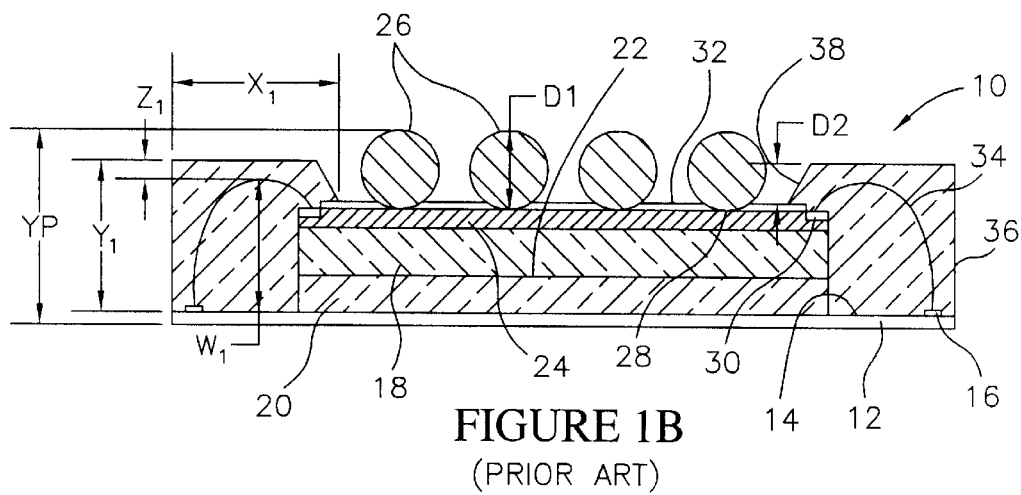
FIG. 1B is an enlarged cross sectional view of the prior art BOC package taken along section line 1B—1B of FIG. 1A.

Also with this configuration of wire bonding sites 66, a loop height W2 of the wires 74 is reduced with respect to the loop height W1 (FIG. 1B) of the prior art BOC package 10. Specifically, the loop height W2 is reduced by a distance approximately equal to the thickness T of the substrate 44 (i.e., W2<W1 by T). If a same covering thickness Z2 for covering the wires 74 is maintained (i.e., Z1=Z2=0.02 mm to 0.10 mm), then the thickness Y2 of the encapsulant 78, and the overall height Y of the package 40 are also reduced by a distance approximately equal to the thickness T of the substrate 44 (i.e., Y<YP by T). Similarly, with the thickness Y2 of the encapsulant 78 being reduced, a width X2 of the molded segments 84, 86 can also be reduced (X2,X1). The BOC package 40 thus has a reduced footprint as well as a reduced profile.

Another advantage of the BOC package 40 is that the molded segments 84, 86 have a more planar exterior surface 80 than with the prior art BOC package 10, because a depth D3 of a recess 82 formed by the molded segments 84, 86 is decreased. In addition, with the more planar exterior surface 80 and smaller recess 82, bleed through of the encapsulant 78 onto the solder mask 60 during molding of the molded segments 84, 86 is reduced.

Referring to FIGS. 3A–3F, steps in a method for fabricating the BOC semiconductor package 40 are illustrated. Although these steps are shown as being performed using a single substrate 44, it is to be understood that the steps can be performed at the same time on multiple substrates 44 to fabricate multiple BOC semiconductor packages 40. For example, multiple substrates 44 can be contained on a panel similar to a lead frame and the steps to follow can be performed on all of the substrates 44 on the panel. As another alternative, multiple semiconductor dice 42 can be contained on a semiconductor wafer, and a wafer level fabrication process can be utilized to attach substrates 44 to the dice 42, and to form multiple BOC packages 40 at the same time. In either case, following the fabrication process the panel or the wafer can be singulated into individual BOC packages 40.

Figure 3A:
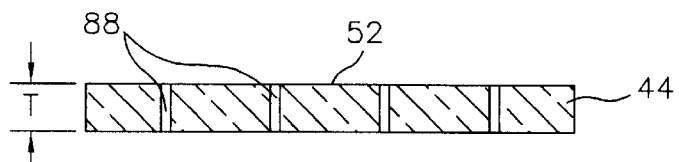
FIGS. 3A–3F are schematic cross sectional views illustrating steps in a method for fabricating the BOC package of FIGS. 2A–2D.

Initially, as shown in FIG. 3A, the substrate 44 can be provided with a desired thickness T (e.g., 0.2 mm to 1.6 mm). As previously mentioned, suitable materials for the substrate 44 include bismaleimide-trizine (BT), epoxy resins ("FR-4" and "FR-5"), and polyimide resins. These materials can be formed with a required thickness, and then punched, machined, or otherwise formed with a required peripheral configuration and with required features. In addition, multiple substrates 44 can be provided on a panel of material similar to a leadframe, which can then be singulated into multiple BOC packages 40 following the fabrication process.

The substrate 44 includes the back side 52 and the circuit side 54, which are the major opposing planar surfaces thereof. As also shown in FIG. 3A, a pattern of openings 88 for the conductive vias 68 are formed through the substrate 44 from the back side 52 to the circuit side 54. The openings 88 can be formed using any suitable process such as laser machining, etching, punching, or drilling. In addition, the pattern of the openings 88 can match the desired pattern of the external contacts 58.

Figure 3B:
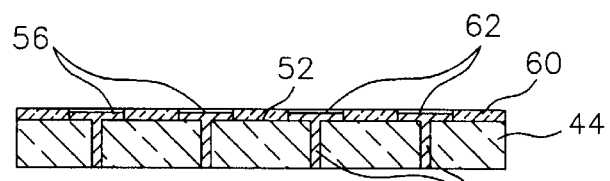

Next, as shown in FIG. 3B, an electrically conductive material, such as a metal, is deposited into the openings 88. Suitable metals include solder, aluminum, titanium, nickel, iridium, copper, gold, tungsten, silver, platinum, palladium, tantalum, molybdenum, and alloys of these metals. The metal can be deposited within the openings 88 using a deposition process such as CVD, electrolytic deposition, or electroless deposition. A solder metal can be screen printed in the openings, or drawn by capillary action using a hot solder wave or a vacuum system. Alternately, rather than being a metal, the conductive material can comprise a conductive polymer, such as a metal filled silicone, or an isotropic epoxy. A conductive polymer can be deposited within the openings 88 by screen printing or stenciling, followed by curing as required.

As also shown in FIG. 3B, the ball bonding sites 56 can be formed on the back side 52 of the substrate 44 in electrical communication with the conductive vias 68. Either a subtractive process (e.g., etching through a mask), or an additive process (e.g., deposition through a mask) can be used to form the ball bonding sites 56. In the illustrative embodiment the ball bonding sites 56 comprise generally square shaped planar pads. However, other geometrical configurations are possible. In addition, the ball bonding sites 56 can comprise any suitable metal, such as copper, nickel or gold, to which the external contacts 58 can be bonded.

As also shown in FIG. 3B, the solder mask 60 can be formed on the back side 52 of the substrate 44. The solder mask 60 can be formed by initially blanket depositing a photoimageable dielectric material, such as a negative or positive tone resist, to a desired thickness (e.g., 1 mils to 4 mils). The photoimageable dielectric material can then be exposed and developed to form the via openings 62, and cured as required. In the illustrative embodiment the via openings 62 align with the ball bonding sites 56 and have the same peripheral outline. One suitable resist is commercially available from Taiyo America Inc. Carson City, Nev. under the trademark "PSR-4000". Another suitable resist is commercially available form Shipley under the trademark "XP-9500".

Figure 3C:
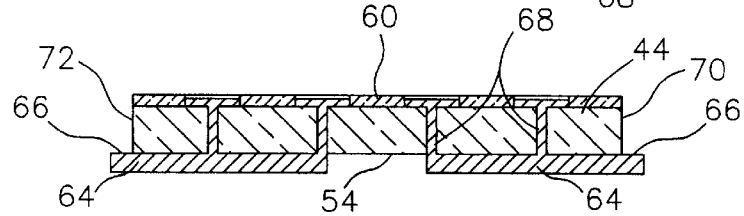

Next, as shown in FIG. 3C, the conductors 64 and the wire bonding sites 66 can be formed on the circuit side 54 of the substrate 44 in a required pattern. A preferred metal for the conductors 64 and the wire bonding sites 66 is copper. One method for forming the conductors 64 and the wire bonding sites 66 is by laminating, or cladding, a copper foil to the substrate 44, and then etching the copper foil through a mask. In this case the copper foil will have a peripheral outline that is greater than that of the substrate 44, such that the bonding sites 66 overhang or project from the edges 70, 72 of the substrate 44. The bonding sites 66 are thus formed by the terminal portions of the conductors 64. In addition, the bonding sites 66 are on the opposing surfaces of the conductors 64 which face away from the circuit side 54 of the substrate 44. If desired, the wire bonding sites 66 can be plated with a metal such as gold or nickel, to facilitate the wire bonding process. Also, the substrate 44 and the conductors 64 can be fabricated from a commercially produced bi-material core, such as a copper clad bismaleimide-triazine (BT) core, available from Mitsubishi Gas Chemical Corp., Japan, as well as other manufacturers. A representative weight of the copper can be from about 0.5 oz. to 2 oz. per square foot.

Figure 3D:
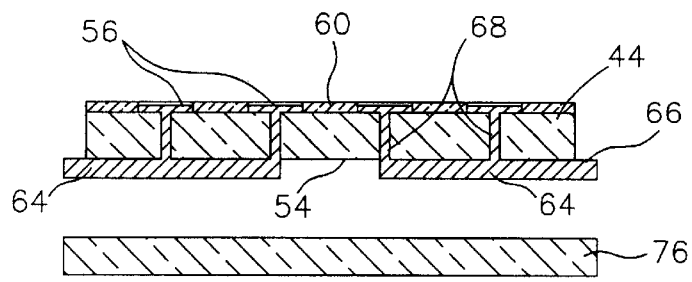

Next, as shown in FIG. 3D, the semiconductor die 42 and the adhesive layer 76 are provided. The semiconductor die 42 includes the contacts 50 in electrical communication with the integrated circuits contained on the die 42. In addition, depending on the fabrication process the die 42 can comprise a singulated die or can be contained on a semiconductor wafer. For example, if the substrate 44 is contained on a panel with multiple substrates, then singulated dice 42 can be attached to the panel. Alternately, the die 42 can be contained on a wafer with a plurality of dice, and a substrate 44 attached to each die 42 on the wafer. The adhesive layer 76 can comprise a double sided adhesive tape, such as polyimide tape. Alternately, the adhesive layer 76 can comprise a deposited and cured polymer such as an epoxy, a polyimide, or an acrylic material. In the case of singulated dice 42 a conventional die attacher can be used to form the adhesive layer 76 and to attach the die 42 to the substrate 44.

Figure 3E:
Figure 3E:
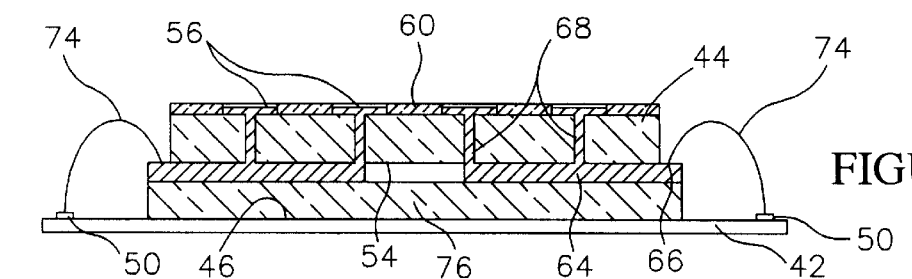

FIG. 3E illustrates the die 42 following attachment to the adhesive layer 76. As shown in FIG. 3E, the circuit side 46 of the die 42 faces the circuit side 54 of the substrate 44. This is in contrast to the conventional BOC package 10 (FIG. 1B) in which the circuit side of the substrate 18 (FIG. 1B) faces outward. However, the wire bonding sites 66 on the opposing side of the conductors 64 are exposed to permit access for wire bonding the wires 74 to the wire bonding sites 66 and to the contacts 50 on the die 42. A conventional wire bonder can be used to wire bond the wires 74. As previously explained, because the substrate 44 has an inward facing circuit side 54 a loop height of the wires 74 is reduced by the thickness T of the substrate 44.

Figure 3F:
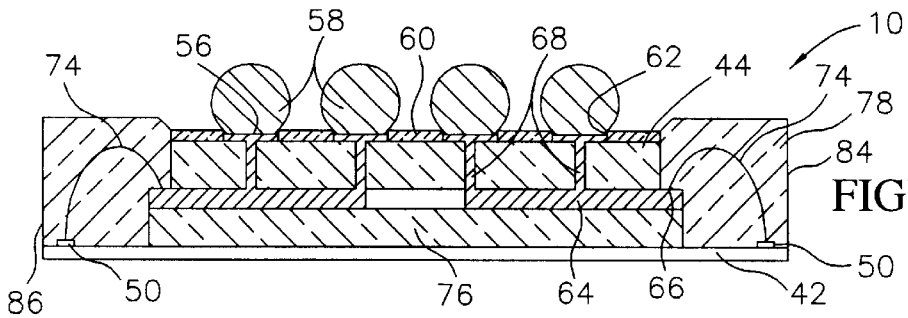

Next, as shown in FIG. 3F, the encapsulating resin 78 can be molded to the die 42, and to the substrate 44 to form the molded segments 84, 86. The encapsulating resin 78 can comprise a Novolac based epoxy formed in a desired shape using a transfer molding process, and then cured using an oven. Because the wires 74 have a reduced loop height the thickness Y2 (FIG. 2B) of the encapsulating resin 78 and the overall height Y (FIG. 2B) of the package 40 are reduced substantially as previously explained.

As also shown in FIG. 3F, the external contacts 58 can be bonded to the ball bonding sites 56 using a suitable bonding process. For example, with the external contacts 58 comprising solder balls a solder reflow process can be employed. In this case solder flux can be deposited on the ball bonding sites 56 and on the external contacts 58. The external contacts 58 can then be placed on the ball bonding sites 56, and a furnace can be used to form metallurgical solder bumps between the external contacts 58 and the ball bonding sites 56. During bonding, the via openings 62 in the solder mask 60 facilitate alignment of the external contacts 58 to the ball bonding sites 56. Alternately rather than a solder reflow process the external contacts 58 can be bonded by welding or brazing process. As another alternative, a laser heating process using a commercial ball bumper apparatus can be used to attach the external contacts 58. Further the external contacts 58 rather than being solder can comprise another metal or a conductive polymer material.

In the completed BOC package 40 the external contacts 58 can be used to establish electrical communication with the integrated circuits contained on the die 42. In addition, the external contacts 58 can be used to bond the BOC package 40 to a mating substrate such as a module or printed circuit board.

Figure 4A:
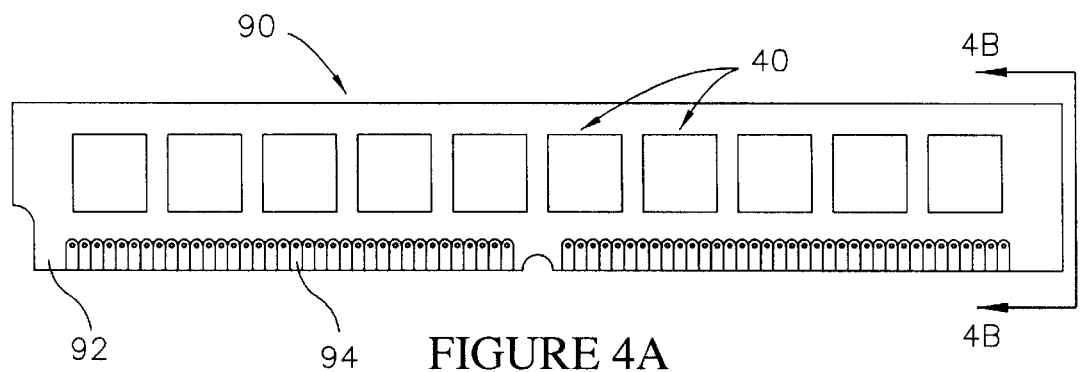
FIG. 4A is a plan view of an electronic assembly that includes BOC packages constructed in accordance with the invention.
Figure 4B:
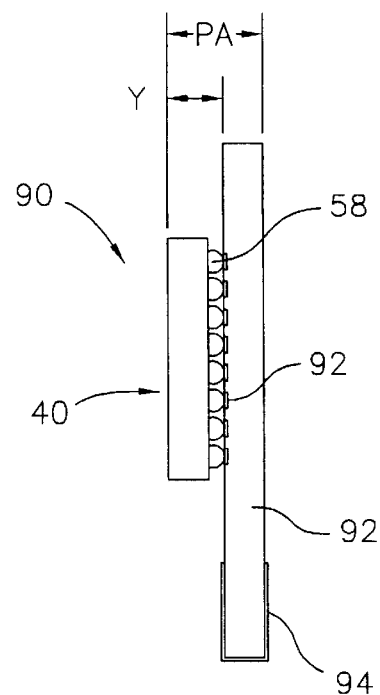
FIG. 4B is a side elevation view of the electronic assembly taken along line 4B—4B of FIG. 4A.

Referring to FIGS. 4A and 4B, an electronic assembly 90 constructed with a plurality of BOC packages 40 is illustrated. In the illustrative embodiment the electronic assembly 90 comprises a multi chip module. However, other electronic assemblies can also be constructed using one or more of the BOC packages 40. The assembly 90 includes a substrate 92, and an edge connector 94 on the substrate 92. The substrate 92 also includes a plurality of electrodes 96 in electrical communication with the edge connector 94. The BOC packages 40 are flip chip mounted to the substrate 92 with the external contacts 58 on the BOC packages 40 bonded to the electrodes 96. Because the BOC packages 40 have a reduced overall height Y (profile), the assembly 90 also has a reduced height YA (profile).

Thus the invention provides an improved BOC semiconductor package, a method for fabricating the package, and improved semiconductor assemblies constructed with the package. While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor package comprising:

providing a semiconductor die;

providing a substrate having a first side, an opposing second side and an edge, the substrate comprising a plurality of conductors on the first side having surfaces, opposing surfaces, portions overhanging the edge, and bonding sites on the opposing surfaces on the portions;

forming an adhesive layer in contact with the first side, the surfaces, and the portions to attach the substrate to the die with the first side acing towards the die and the second side facing away from the die; and bonding a plurality of wires to the bonding sites and to the die.

2. The method of claim 1 further comprising forming a plurality of external contacts on the second side in electrical communication with the conductors and encapsulating the wires in an encapsulant.

3. The method of claim 1 further comprising forming a mask on the second side having a plurality of openings and forming a plurality of terminal contacts in the openings in electrical communication with the conductors.

4. The method of claim 1 wherein the adhesive layer comprises tape or a cured polymer.

5. The method of claim 1 wherein the substrate comprises a polymer resin and glass fibers.

6. A method for fabricating a semiconductor package comprising:

providing a semiconductor die comprising a circuit side, an edge and a plurality of die contacts on the circuit side;

providing a substrate having a first side and a second side, the substrate comprising a plurality of conductors on the first side, a plurality of bonding sites proximate to the first side comprising portions of the conductors extending from the edge, and a plurality of external contacts on the second side in electrical communication with the conductors, the conductors having surfaces and opposing surfaces on the portions wherein the bonding sites are located;

forming an adhesive layer between the first side and the circuit side in contact with the surfaces and supporting the portions; and bonding a plurality of wires to the bonding sites and to the die contacts.

7. The method of claim 6 further comprising encapsulating the wires and at least some of the substrate and the die in an encapsulant to form molded segments.

8. The method of claim 6 wherein the adhesive layer has a peripheral shape larger than that of the substrate.

9. The method of claim 6 wherein the external contacts comprise balls in a ball grid array.

10. The method of claim 6 wherein the substrate comprises a plurality of second bonding sites on the second side in a grid array in electrical communication with the conductors and configured to attach the external contacts to the substrate.

11. The method of claim 6 wherein the adhesive layer comprises tape or a cured polymer.

12. A method for fabricating a board-on-chip semiconductor package comprising:

providing a semiconductor die comprising a face and a plurality of die contacts on the face;

providing a substrate comprising a circuit side, a back side, an edge, a plurality of conductors on the circuit side having surfaces and opposing surfaces, and a plurality of bonding sites on the opposing surfaces comprising portions of the conductors overhanging the edge;

forming an adhesive layer between the circuit side and the face in contact with the surfaces;

wire bonding a plurality of wires to the bonding sites and to the die contacts;

encapsulating the wires in an encapsulant; and forming a plurality of external contacts on the back side of the substrate in electrical communication with the conductors.

13. The method of claim 12 wherein the encapsulating step comprises forming molded segments on the die and the edge of the substrate.

14. The method of claim 12 wherein the external contacts comprise balls in a ball grid array.

15. The method of claim 12 further comprising forming a solder mask on the back side of the substrate having a plurality of openings for the external contacts.

16. The method of claim 12 wherein the substrate comprises a material selected from the group consisting of bismaleimide-trizine (BT), epoxy, and polyimide.

17. The method of claim 12 wherein the adhesive layer comprises tape or a cured polymer.

18. A method for fabricating a semiconductor package comprising:

providing a semiconductor die comprising a face and a plurality of die contacts on the face;

providing a substrate having an edge, a circuit side and a back side;

forming a plurality of conductors on the circuit side having surfaces and opposing surfaces, and a plurality of bonding sites on the opposing surfaces on portions of the conductors overhanging the edge;

forming a plurality of external contacts on the back side in electrical communication with the conductors;

forming an adhesive layer between the circuit side and the face in contact with the surfaces configured to attach the substrate to the die and to support the portions;

bonding a plurality of wires to the die contacts and to the bonding sites; and molding an encapsulant to the die and to the substrate.

19. The method of claim 18 wherein the forming the external contacts step comprises bonding or forming balls on the substrate.

20. The method of claim 18 wherein the forming the adhesive layer step comprises attaching a polymer tape to the die or the substrate.

21. The method of claim 18 wherein the forming the adhesive layer step comprises applying a curable polymer to the die or the substrate.

22. The method of claim 18 further comprising forming a mask on the back side of the substrate having openings for the external contacts.

23. The method of claim 18 wherein the substrate comprises a material selected from the group consisting of bismaleimide-trizine (BT), epoxy, and polyimide.

* * * * *

UNITED STATES PATENT AND TRADEMARK OFFICE
CERTIFICATE OF CORRECTION

PATENT NO.     : 6,638,792 B2                                                      Page 1 of 1
DATED          : October 28, 2003
INVENTOR(S)    : Chong Chin Hui, Lee Choon Kian and Lee Kian Chai It is certified that error appears in the above-identified patent and that said Letters Patent is hereby corrected as shown below:

Column 8,
Line 62, change "acing" to -- facing --.

Signed and Sealed this

Ninth Day of December, 2003

JAMES E. ROGAN
*Director of the United States Patent and Trademark Office*